(12) United States Patent
Konheim (10) Patent No.: US 11,302,162 B2
(45) Date of Patent: Apr. 12, 2022

(54) MULTIFUNCTION TERMINALS FOR ALARM SYSTEMS

(71) Applicant: Keith Michael Konheim, Santa Barbara, CA (US)

(72) Inventor: Keith Michael Konheim, Santa Barbara, CA (US)

( * ) Notice: Subject to any disclaimer, the term of this patent is extended or adjusted under 35 U.S.C. 154(b) by 0 days.

(21) Appl. No.: 16/985,085

(22) Filed: Aug. 4, 2020

(65) Prior Publication Data

US 2021/0020009 A1    Jan. 21, 2021

Related U.S. Application Data

(63) Continuation-in-part of application No. 16/164,857, filed on Oct. 19, 2018, now abandoned.

(60) Provisional application No. 62/574,320, filed on Oct. 19, 2017.

(51) Int. Cl.
*H03K 19/0185* (2006.01)
*G08B 13/22* (2006.01)

(52) U.S. Cl.
CPC ..... *G08B 13/22* (2013.01); *H03K 19/018507* (2013.01)

(58) Field of Classification Search
CPC ........... G08B 13/22; H03K 19/018507; H03K 19/0175; H03K 17/6872
USPC ................................. 327/437, 355
See application file for complete search history.

(56) References Cited

U.S. PATENT DOCUMENTS

| | | | |
|---|---|---|---|
| 3,703,000 A * | 11/1972 | Kaplan | G08B 13/22 340/662 |
| 3,786,501 A * | 1/1974 | Marnerakis | G01R 19/16571 340/509 |
| 5,220,522 A | 6/1993 | Wilson et al. | |
| 10,630,176 B2 * | 4/2020 | Yamazaki | G05B 19/048 |
| 2011/0175720 A1 | 7/2011 | Hsieh | |
| 2013/0278421 A1* | 10/2013 | Sutton | G06F 13/4291 340/540 |
| 2014/0084988 A1* | 3/2014 | Mishra | H03K 17/6871 327/437 |
| 2017/0010994 A1 | 1/2017 | Stoll | |
| 2017/0019106 A1* | 1/2017 | Akahane | H03K 19/00361 |

* cited by examiner

*Primary Examiner* — Albert K Wong
(74) *Attorney, Agent, or Firm* — Cislo & Thomas, LLP (57) ABSTRACT

The present invention is directed to circuit that improves alarm systems by adding the flexibility through software to configure an output terminal for typical device functions of Alarm System Devices. With a number of these circuits on a single Circuit Board, installers can use fewer different Circuit Boards. Alarm systems may be constructed from many different components and sensors. These components and sensors may be connected either with wires or wireless networks. This present invention improves the ability to connect components and sensors for a Wired Alarm System. Present Alarm systems have dedicated terminals for each different sensor, keypad or human interface, Contacts for Windows and Doors, Solenoids to remotely unlock Doors.

12 Claims, 8 Drawing Sheets

MULTIFUNCTION TERMINALS FOR ALARM SYSTEMS

CROSS-REFERENCE TO RELATED APPLICATION

This patent application is a continuation-in-part application of U.S. patent application Ser. No. 16/164,857, filed Oct. 19, 2018 which claims the benefit of U.S. Provisional Patent Application Ser. No. 62/574,320, entitled "Multifunction Terminals for Alarm Systems," filed Oct. 19, 2017, which applications are incorporated in their entirety here by this reference.

BACKGROUND

Alarm systems have evolved to perform many added functions besides detecting a door in the open or closed position. Presently the design used is to assign a specific terminal to specific functions, such as electronic devices to unlock a door, data keypads or other user interfaces or analog voltages measurements for the industry standard of an End of Line Resistor to detect door and window closures.

If additional terminals for doors are needed beyond what is available on the circuit board, a second board must be connected. These additional connection boards are also specific to the number and type of applications. For instance, most data for Keypads or entry or exit access is transmitted on a bus (Multiple Keypads can share a single bus on some systems) using one end of a differential drive IC. The terminal connected to this IC can only perform one function, that of data transmission or receiving.

The purpose of this invention is to be able to use, but not limited to devices such as Keypads, Frequency Operated Button, Electronic Key, Card Readers, Door Lock Solenoids, End of Line resistance measurements used in Alarm Systems, but not limited to Alarm Systems such as a sprinkler controller, connected to a terminal and configured by software through specific bits attached to the terminal circuit.

SUMMARY

The present invention is directed to circuit that improves alarm systems by adding the flexibility through software to configure an output terminal for typical device functions of Alarm System Devices. With a number of these circuits on a single Circuit Board, installers can use fewer different Circuit Boards. Alarm systems may be constructed from many different components and sensors. These components and sensors may be connected either with wires or wireless networks. This present Invention improves the ability to connect components and sensors for a Wired Alarm System. Present Alarm systems have dedicated terminals for each different sensor, keypad or human interface, Contacts for Windows and Doors, Solenoids to remotely unlock Doors. For installations requiring additional connections for a particular type of sensors such as windows or doors, additional circuit boards must be connected as the 'free' connections are usually purposed for other types of devices or sensors.

DETAILED DESCRIPTION OF THE INVENTION

The detailed description set forth below in connection with the appended drawings is intended as a description of presently-preferred embodiments of the invention and is not intended to represent the only forms in which the present invention may be constructed or utilized. The description sets forth the functions and the sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

The present disclosure may use the term Bit throughout to describe a binary representation of a basic unit of digital communications, information theory and computing.

A Bit may represent a digit in a typical binary word. In base 10, each digit from right to left increases in value at the rate of ×10 power. This may be translated to base 2, where every digit grows by ×2 power where the conversion to represent numbers is simply a voltage present or ground. Early Micro Processors may have used 5 Volts to represent Logic 'High.' To conserve energy modern processors may use 3.3 Volts or less. With a lower voltage, less heat may be generated and less energy may be wasted. For example, DDR4 memory part Number MT40A256M16 manufactured by MICRON TECHNOLOGY INC. runs on a voltage of 1.2 Volts. Microprocessors need a higher voltage as some functions run through many different internal logic parts.

As referenced in present disclosure a bit may be a single digital Port as part of a Micro Processing Unit ("MPU"). The full port on a Micro Processor Unit may be composed of any number of singular 'Ports' that may be grouped internally into 8, 16, 32, 64 or larger digital 'Words'. For example, the A8 MPU used in some APPLE iPHONES is manufactured by the TAIWAN SEMICONDUCTOR MANUFACTURING COMPANY, LIMITED. Since this is a custom integrated circuit ("IC"), there may be, for example, 1, 2, 3, or more ports of 64-bit words that are connected to pins that may be available to interface with other electronic parts.

The connection(s) to the circuit may be made at an external pin of a 'Port' of the MPU.

To use a circuit, an MPU may have pins or ports that may be configurable to read Analog voltages in addition to inputting and outputting Binary Digital Voltages.

In this application the port may be configured internally to the MPU to measure analog values, input binary digital values, output binary digital values, or pulse width data.

Pulse width data is a method of changing the average voltage at the pin by dividing the time period up into many parts (more parts equals smoother wave form). For example, if you were to divide a period into 20 parts and for the first 10 parts turned on and off with equal spacing, the voltage would be roughly ½ of the voltage at the pin. If, for example, you made the next 10 pulsed off for ¼ of the same period used before and on for ¾ or 3 times the 'off' period, the voltage at the pin would be roughly 75% of the digital voltage when full turned on.

This disclosure may reference the term Micro Processor Unit or MPU as a digitally controlled Bit. It is irrelevant what drives the digital bits in the Multi-Purpose Terminal for Alarm System's Circuit. AMD versus Intel, CISC (complex instruction set computers) versus RISC (reduced instruction set computers) Modern microprocessors typically incorporate the functionality of a clock, central processing unit (CPU), arithmetic logic unit (ALU), floating point unit (FPU), control unit (CU), memory management unit (MMU), interrupts, input/output interfaces, and cache. A Micro Processor Unit contains the parts needed to perform the basic functions of a computer.

The present disclosure may refer to pulse-width modulation or PWM, which refers to a standard method of converting a high voltage into a lower voltage.

In some embodiments, one of the functions of the present invention may be data communication with data entry 'Keypads.' This invention may enable an Alarm System to communicate with keypads that may use various voltage levels on their communication lines, for example, between an alarm system and a keypad.

In some embodiments, another function of this invention may be, for example, to operate a solenoid or other electronic device to electronically control a mechanism that may, for example, unlock a door.

In some embodiments, another function of the present invention may be to, for example, measure resistance in a line typically used on sensors for windows and doors that may indicate that the doors are closed.

In some embodiments, another function of the present invention may be to drive a speaker.

In some embodiments of the present invention, another function the circuit may perform may be to output a standard 24 VAC to control a sprinkler valve, for this function, two terminals may be used and the frequency and/or the voltage may not be limited to 24 Volts or 50 or 60 Hertz.

Overview

Figure 1:
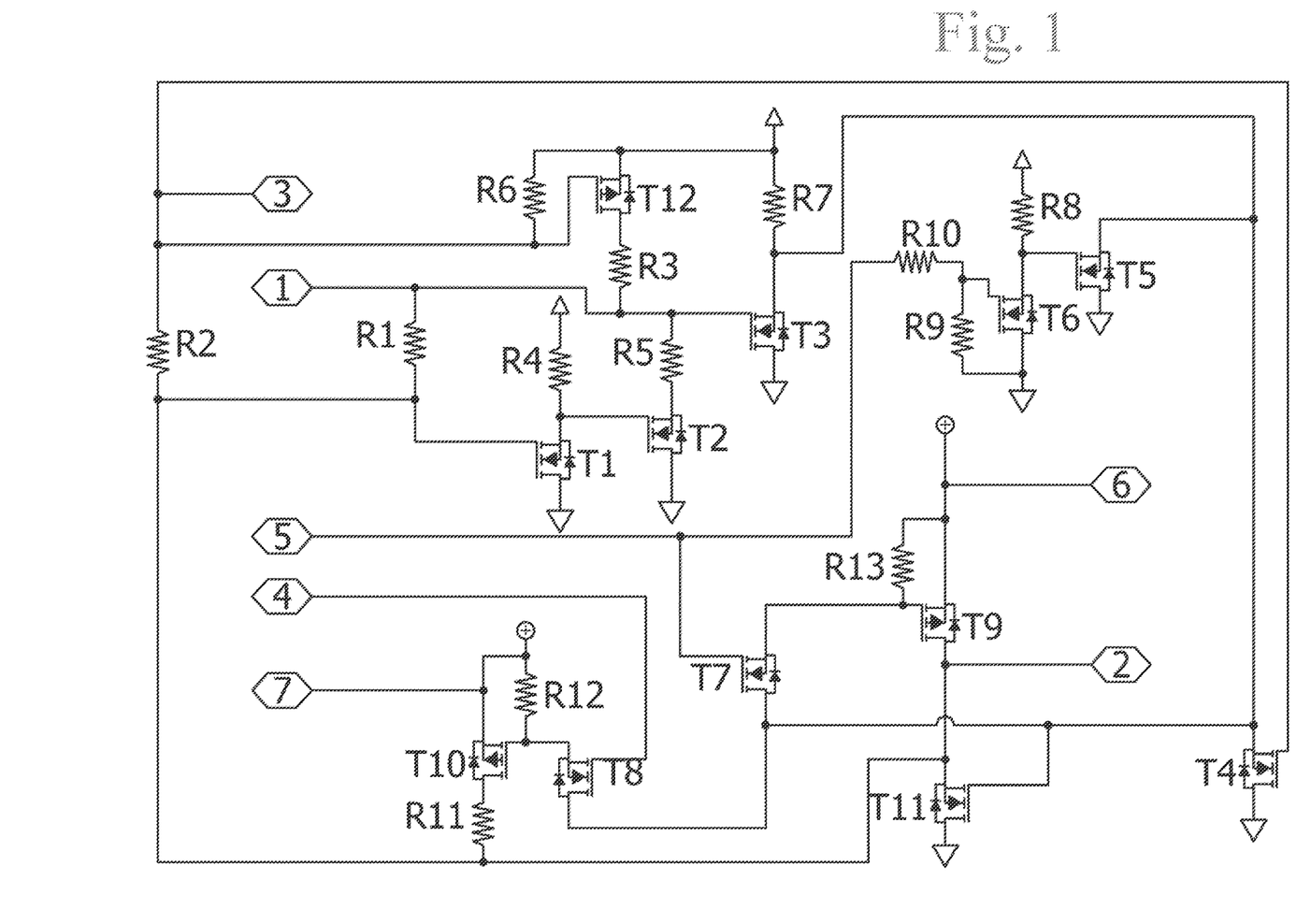
FIG. 1 shows the schematic of the multifunction terminal for alarm systems.

Referring to FIG. 1, in some embodiments a bit from an MPU capable of A/D measurements plus outputting binary numbers at a 3.3 Volt Logic Level may be connected to 1. A second bit, for enabling typical Alarm System Analog measurements may be connected to 3. A third bit, at the typical 3.3 Volt Binary Output may be connected to 4, which may enable the output of a current limited signal, where a high current may damage external devices. A fourth bit, at the typical 3.3 Volt Binary Output may be connected to 5. A Voltage source may be connected to 6 and an output terminal may be connected to 2.

In some embodiments, as is depicted in the configuration of the circuit in FIG. 1, there may be a plurality of transistors. The transistors may be for example MOSFETs and may also be P Channel MOSFETS or N Channel MOSFETS. A MOSFET is a Metal Oxide Semiconductor Field Effect Transistor, which is a semiconductor device for switching and amplifying electronic signals MOSFETS are a Three-terminal device that have source (S), gate (G), drain (D). MOSFETs may also have a body (B) terminal, usually to dissipate heat. In some embodiments, the MOSFETs may have a fourth terminal, which may be used to dissipate heat which may be connected to a Source or Drain of a part.

In some embodiments, as is depicted in the configuration of the circuit in FIG. 1, there may be a plurality of resistors. Resistors may be used to reduce current flow or create a voltage drop in circuits.

In some embodiments, there may be an analog measurement mode where the bit connected to 1 on the MPU may be configured with software to measure analog voltages. In such an embodiment, 3 may be set to high and 4 and 5 may be set to Low. The voltage at 6 may be N/A. The resistance connected between 2 and Ground as is typical of End of Line ("EOL").

Resistors may create a Voltage at 2 who's current may go through R2 creating a parallel path through R1 and R5 thereby creating a voltage across R1. For example, if an EOL Resistance of 1.8K is used, there may be a voltage of 0.5 Volts at 2. This may not be enough for the Gate at T1 so T1 may remain off and T2 may be on adding R5 1000Ω at the MPU bit to Ground. This may add a second voltage divider of 3300Ω plus 1000Ω or 4300Ω to ground from the Junction of R2 and the EOL Resistor, which means there will be approximately 23% of the voltage at the R2 & EOL Junction and at the MPU Pin.

In some embodiments, the Voltage may be divided by R1 and R5 with the source voltage at R2 and the EOL resistor. A Voltage source may be placed at 2 in place of a resistor and may be detected by setting the bit connected to 3 to either Ground or a Logic input. When set the bit connected to 3 may be set to a Low, R3 a 100,000Ω may become a pullup resistor. With a voltage below the Gate Threshold of T1, T2 may remain on, which may create a Voltage divider of R3 (100K) over R5 in parallel with R1 plus the EOL Resistor which is approximately 836Ω. So with an 1800Ω EOL resistor and setting '3' to a Logic Low, the voltage at the MPU bit may drop to almost zero volts.

In some embodiments, setting the value of R2 to a value slightly lower than the End Of Line Resistor with a MOSFET T1, that has a 'Gate-Source Threshold Voltage that may be 'On' may leave R1 to be input resistance without a Voltage Drop.

In some embodiments of the present invention, there may be a data receive mode. In some of the embodiments with the data receive mode the bit connected to 1 on the MPU may be configured to an input. The bit connected to 3 on the MPU may be configured to output a Low grounding the gate at T12 thus turning on the P Channel MOSFET. In some embodiments, for example, when a High signal is placed at 2, the high signal may be anything from the max Gate to Source rating to turn on T1 to the Maximum voltage rating for T1, Gate to Drain, T1 may conduct. This may then turn off T2 and the voltage at 1 may be pulled through R3 and T12 to 3.3 Volts. When a Low signal is placed at 2, for example, T1 may be off, turning on T2, which may provide a Logic Low at 1.

In some embodiments of the present invention, there may be a data transmit or drive mode. In such embodiments, there may be a bit connected to 1 on the MPU, which may be configured to an output. In some embodiments, 3 may be an Output set at a logic Low, which may disable T4, which may enable the Gate of T11 to be pulled high. By outputting a current limited voltage, a logic High may be set on both 1 and 4. With 4 remaining high, 5 may be set Low. In some embodiments, when 1 is high with a corresponding high on 4, T3 may provide the Ground for T8, which may turn on T10 which may provide the Voltage at the Source of T10 through R11 to 2. When T8 has a path to ground on the Source, this may also Ground the Gate of T11, which may keep this MOSFET in the off state A Low at 1 may turn T10 off, without turning T11 on.

In some embodiments of the present invention there may be a data transmit or drive mode where a true output Low at 2 may be pulled to ground, the bit connected to 1 on the MPU may be configured to an output. In some embodiments, outputting a Low on 1 and a High on 5 may turn on T11, which may sink or pull the Voltage at 2 to Ground. The gate of T6 High may turn off T5, which may enable R7 to pull the Gate of T11 high, which may turn T11 on, which may sink 2 to ground.

In some embodiments there may be a data transmit or drive mode where a non-current limited output at 2 may be required, which may output a high on 1 and a high on 5 may turn on T9 by providing a Low at the Gate of T9 through T7. This may also ground the Gate of T11, keeping this MOSFET in the off state. This may place the voltage at 6, on 2 through T9. In some embodiments, when T7 has a path to ground on the Source from T3, this may also Ground the Gate of T11, which may keep this MOSFET in the off state. The voltage at 2 may be controlled with Pulse Width Modulation ("PWM") at 5. With a Voltage such as, for example, 34 Volts at 6, a sine wave for 24 Volts may be generated at a frequency such as, for example, 60 or 50 Hertz with PWM on 5. This is not limited to these lower frequencies as another common frequency may be 400 Hz.

In some embodiments, there may be an Alternating Current, for example, where two such circuits may be used alternating between Sinking and Driving at 2, at the frequency and Voltage required. PWM may be a standard method of converting a high voltage into a lower voltage. Any Voltage lower than that at 6, such as 12 Volts, 5 Volts, or 3.3 Volts may be generated with the proper PWM signal on 5.

In some embodiments, each of the described modes may be utilized by configuring the pins of the driving circuit to operate in such a mode. As is described above, the purpose of this invention is to be able to use, such as, for example, Keypads, Frequency Operated Button, Electronic Key, Card Readers, Door Lock Solenoids, End of Line resistance measurements used in Alarm Systems. This invention is also not limited to Alarm Systems such as a sprinkler controller, connected to a terminal and configured by software through specific bits attached to the terminal circuit. Each of these external devices may require a different configuration and also may require a different mode, which is why the present invention is configured to handle various devices by specifically configuring the pins to operate in the mode necessary for the external device.

As is shown in the Circuit depicted in FIGS. 2-8, in some embodiments, there may be an interface between a typical Micro Processor Unit (MPU) and devices found in modern Alarm systems, such as key pads, fingerprint scanners, electronic door strikes or latches, window contacts, among others and may be used to operate a variety of other devices. The circuit may translate the low voltages on MPUs to a higher voltage to run devices or communicate over the distances found in most homes and businesses. As is shown in FIGS. 2-8, there may be connections from ports or pins of an MPU with parts of the Circuit and are shown as being connected by placing these inside a border of the circuit.

The illustration shown in FIGS. 2-8 of an MPU depict the major internal parts and images of the pins used in some of the packages of MPUs that some Integrated Circuit (ICs) use. In high density Printed Circuit Boards most MPU parts use a Ball Grid Array, which are very small squares of contact and are on the bottom of the IC part in place of pins that extend from the sides of the Integrated Circuit. Depicted in FIGS. 2-8 are the parts, such as, for example, the Central Processing Unit or CPU, ROM or read only memory, RAM or Random access memory, and the input and output ports, many of which may be internally configured to measure analog voltages.

The currents that the typical MPU can Source (i.e. to provide a voltage/current) or Sink (i.e. to provide a path to ground) may typically be low, close to 5 milli Amps (0.005 Amps). These values may vary and specific values can be found in the data sheets of an MPU. Voltages that powered most MPUs used to be 5 Volts (such as a 6800) but have migrated to 3.3 Volts. However, there are some processors that may run on lower voltages such as 2.8 Volts. The lower the voltage the less energy may be wasted in heat and power consumed.

Most Devices for Alarm Systems such as Keypads or Fingerprint Scanners or RFI Fobs require higher voltages for signals to travel longer distances than the typical cable for USB signals. A large number of these systems use 12V logic levels. While there are many communication standards, most alarm manufactures use proprietary communication specifications.

In some embodiments, the Low current output 7 of the circuit may utilize a resistor in series with the voltage/current source. This may be implemented to interface with data communication lines where transmission specific Integrated Circuits are used. These ICs may have the capability of sinking (bringing the line logic value by connecting it to ground) approximately 60 mA of current. In some embodiments, for example, if the Circuit of the present invention is used for data communication and is connected to an External communication 'Bus', the 'low Current' mode of 'Multipurpose Terminals for Alarm Systems' may be designed to allow data communication ICs to be able to bring the bus to a Logic 'Low.'

In some embodiments, implementing a 'High Current Mode,' may utilize proper PCB trace Spacing, Width and Thickness and a Voltage/Current supply and choosing the proper MOSFETs for T-9, a 'P' Channel MOSFET and T-11, an 'N' Channel MOSFET very high currents and Voltages may be switched.

The circuit of the present invention may be designed such that the 'N' Channel MOSFET T-11 conducts current to ground when MPU Bit-X is Low and high Current Enable is 'high.' With MPU Bit-X at a logic 'high' and high Current Enable is 'high,' the 'P' Channel MOSFET T-9 may conduct from the 'High Current Voltage Source'.

In some embodiments, by using 2 'Multipurpose Terminals for Alarm Systems' Circuits, AC Devices such as Coils may be driven.

Figure 8:
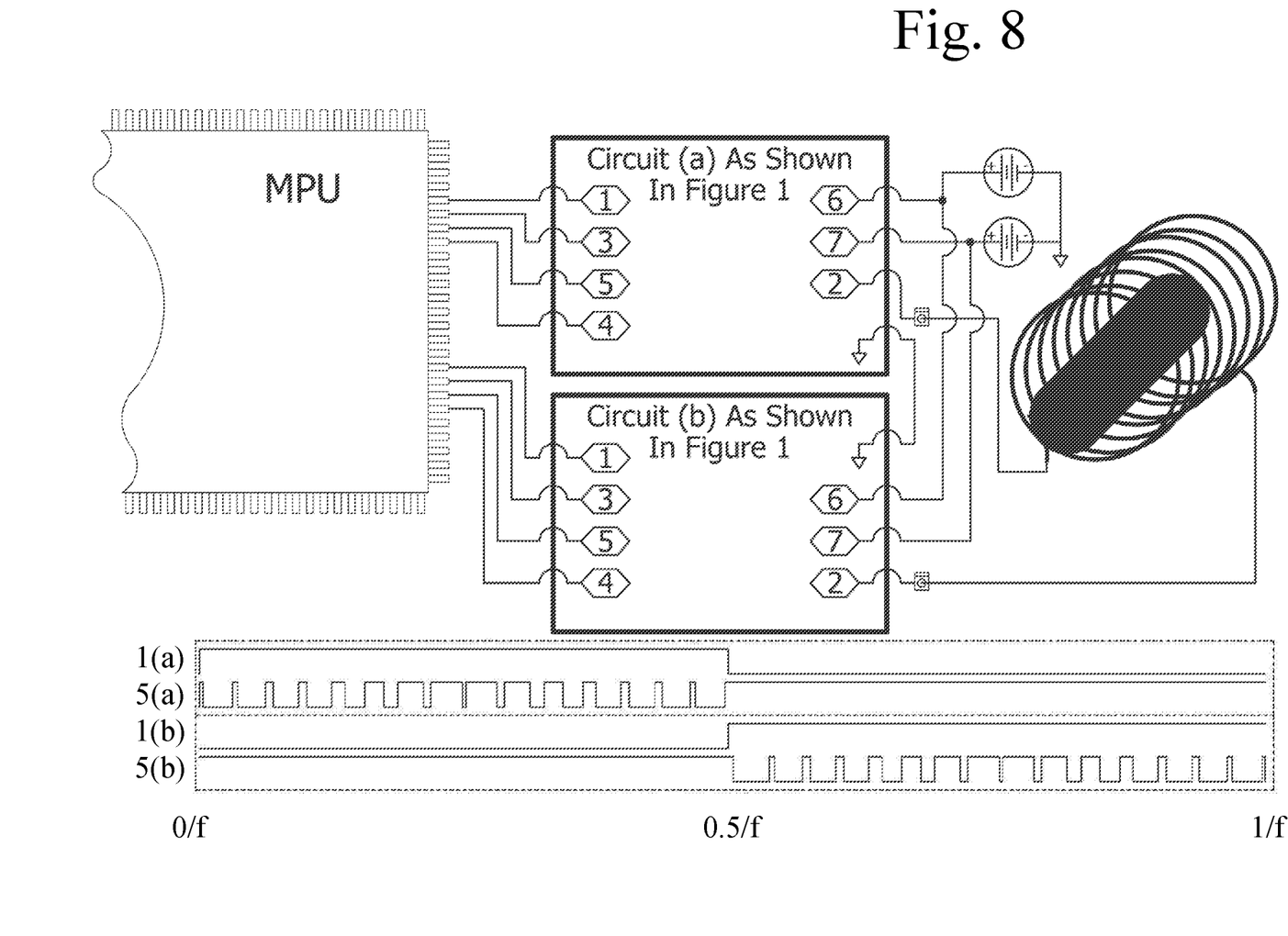
FIG. 8 shows an alternating current sine wave mode with an example input to generate alternating current sign wave with the multifunction terminal for alarm systems.

In some embodiments, as depicted in FIG. 8 with Bit-X_1 at 'Logic High', when 'High Current Enable_1' is brought 'high', P-Channel MOSFET T-9 may turn on. With varying a Pulse Width over the period from 0/f to 1/2f as in FIG. 8, a Sine Wave may be the resulting output. Bit X_2 may be set to a 'Logic Low' with high Current Enable_2 may be set to a 'Logic High' to turn on MOSFET T-11 of the second circuit to provide a return path for the current.

For the second half of the Period, the bits may be reversed. MPU Bit X_2 may be set to 'Logic High' with a Pulse Width Modulated signal on High Current Enable_2, modulated such that a Sine Wave may be generated. MPU Bit X-1 may be set to 'Logic Low' with High Current Enable_1 set to 'Logic High' providing a path to ground for the current going through the Coil or other AC Device.

In FIGS. 1-8, there are numerous terminals depicted, which, in some embodiments are Screw Terminals, which may be used to connect wires to a Printed Circuit Board. The terminals are not limited to being screw terminals as many other types of terminals, such as, for example Latch Terminals, Spring Terminals, or a Post for a wire to be Soldered and or attached to may be used as well.

In FIGS. 1-8 the Symbol and words "To Devices" may represent the output of the Electronic Circuit, Multipurpose Terminals for Alarm Systems. The thicker square border in FIGS. 2-8 may depict or encompasses the circuit. The hexagonal box of FIGS. 2-8 that protrudes past the outline depicts that there may be a connection between a part of the circuit and parts on the printed Circuit Board which physically holds the parts that make up the circuit.

In order to deliver energy, there must be a return path or 2 connections to create the Voltage Potential and the Path for a Current to flow.

Figure 2:
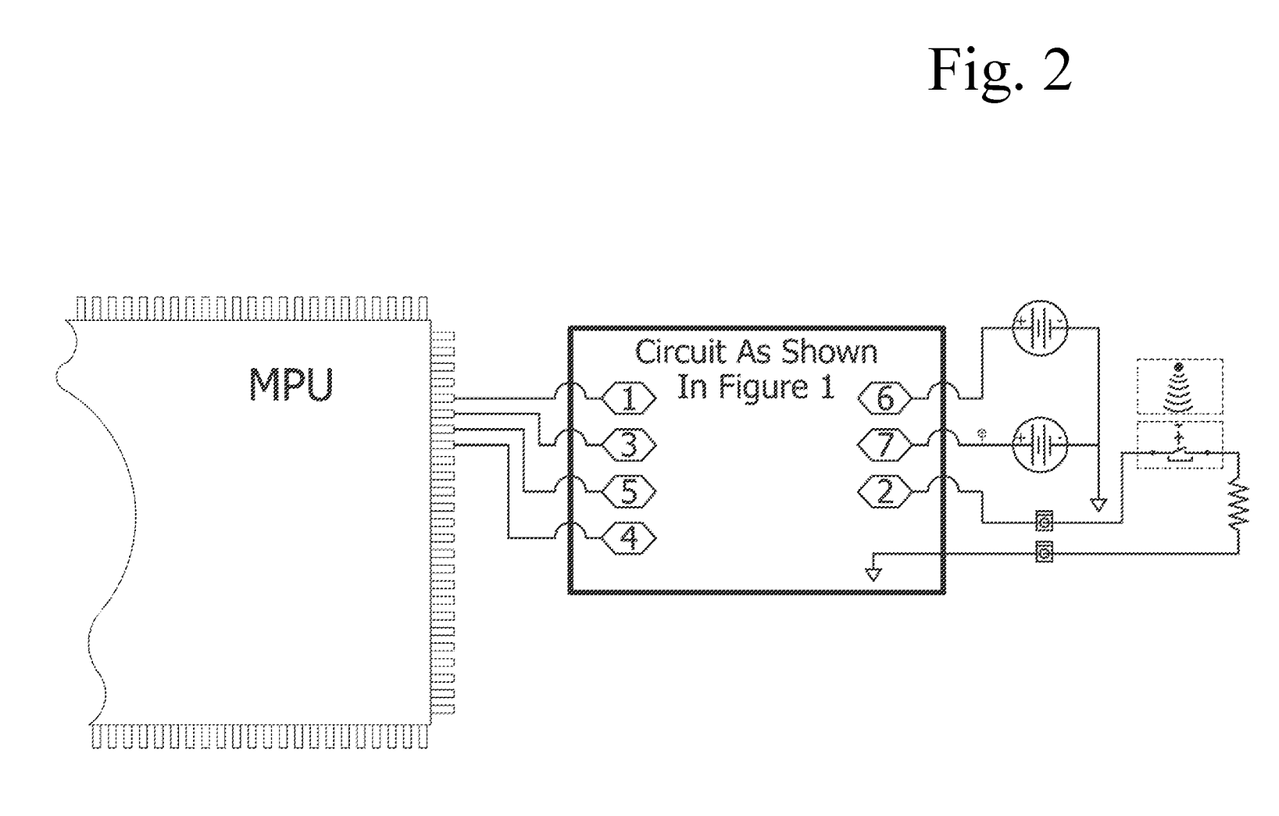
FIG. 2 shows an analog measurement mode of the multifunction terminal for alarm systems.

In some embodiments such as the configuration of FIG. 2 depict Magnetic Contacts, which may be a depiction of a switch activated by the magnetic fields of a magnet. Normally the switch may be a closed contact type with removal of the magnetic field switching the contacts to the Open Position.

In some embodiments, the End of Line or EOL resistor is a resistor usually placed very close physically to the switch. In the circuit, there may be resistance in series such that there may be a Voltage Drop at the terminal or 'To Devices' place in the circuit. When the Analog Enable Pin is set to Output a Digital '1' or 3.3 Volts, if the Switch is in the closed position, a Voltage dependent on both the internal resistor in series and the EOL resistor may be present at 'To Devices.'

In some embodiments, such as, for example, in FIG. 1 there may be 13 resistors. In some embodiments the resistors may be, for example, 1K resistors, 2.15K resistors, 3.3K resistors, 4.7K resistors, 10K resistors, 33.2K resistors, 100K resistors, or 200 1/8 W Resistors. The resistors used may also be of varying other types to restrict the flow of electricity as necessary in various embodiments of the present invention.

Analog Measurement Mode

As is depicted in in FIG. 2, some embodiments of the present invention there may be an analog measurement mode. The analog measurement mode may be initiated by configuring the MPU-Bit-X into an analog measurement state and Analog Enable into a Logic High. This may be configured as an End of Line (EOL) resistor, which may be connected at the Devices junction in the circuit as depicted in FIG. 1. For some embodiments, for example, Alarm Technicians may solder the resistor of the present invention at a door or window contact switch that may be closed when the door or window is closed, which may complete the path through R2-10K to ground.

In some embodiments, resistance values for this mode may have been chosen to work with typical EOL (End of Line) resistors used by various Alarm manufactures at the present time and R2-10K may be altered. If values much greater than these are used, R2 may be changed to match such that the voltage expected is lower than the Gate Threshold On voltage of MOSFETs T1 or T3. In some embodiments, a Resistor Divider Network or Voltage attenuator may be used to Lower the Voltage such as, for example, to keep the voltage from turning on the gate.

In some embodiments, Analog Enable may be acting as a 3.3 Volt pull up voltage source who's current may run through the R2-10 KΩ to 'Device' which is meant to be connected to a switch and an End Of Line resistor (1800Ω) to ground which is depicted in Figure-X.

In some embodiments, with Analog Enable High, 3.3V/11800Ω=0.000279 Amps times the 1800Ω=0.5 Volts. When Analog Enable goes Low, it may turn on the 'P' Channel MOSFET T12, there may be 3.3 Volts going through R3-100K then R1-3.3K and then the EOL Resistor 1800Ω to ground. 105,100 Ωs 3.3V/105100Ω=0.0000313A times 1800Ω=0.0565 Volts.

In some embodiments, if a voltage is injected at the junction attached to 'Devices,' there may not be a voltage change. The engineer may want to use an A/D converter with 12 or 16 bit resolution as each step, for example, at 3.3 Volts with 10 bits there may be 0.0032 Volts per step resolution. At 16 bits of resolution each measurement bit may be approximately 0.00005 Volts. These numbers are approximate as they are dependent on the methods used internally to the microprocessor to convert analog voltages into a digital value.

Data Transmit and Receive Mode

Figure 3:
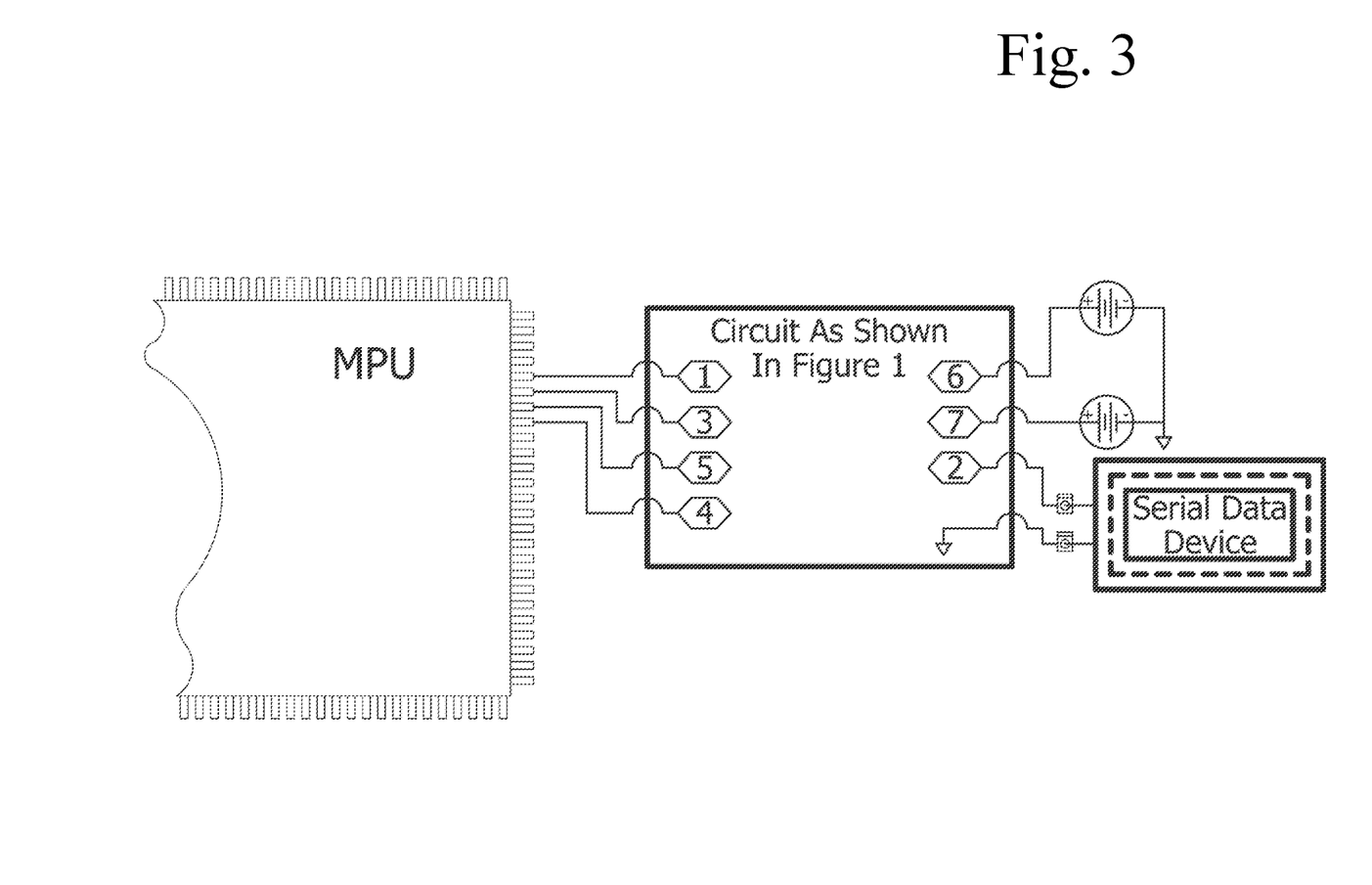
FIG. 3 shows a data receive mode of the data transmit and receive mode of the multifunction terminal for alarm systems.
Figure 4:
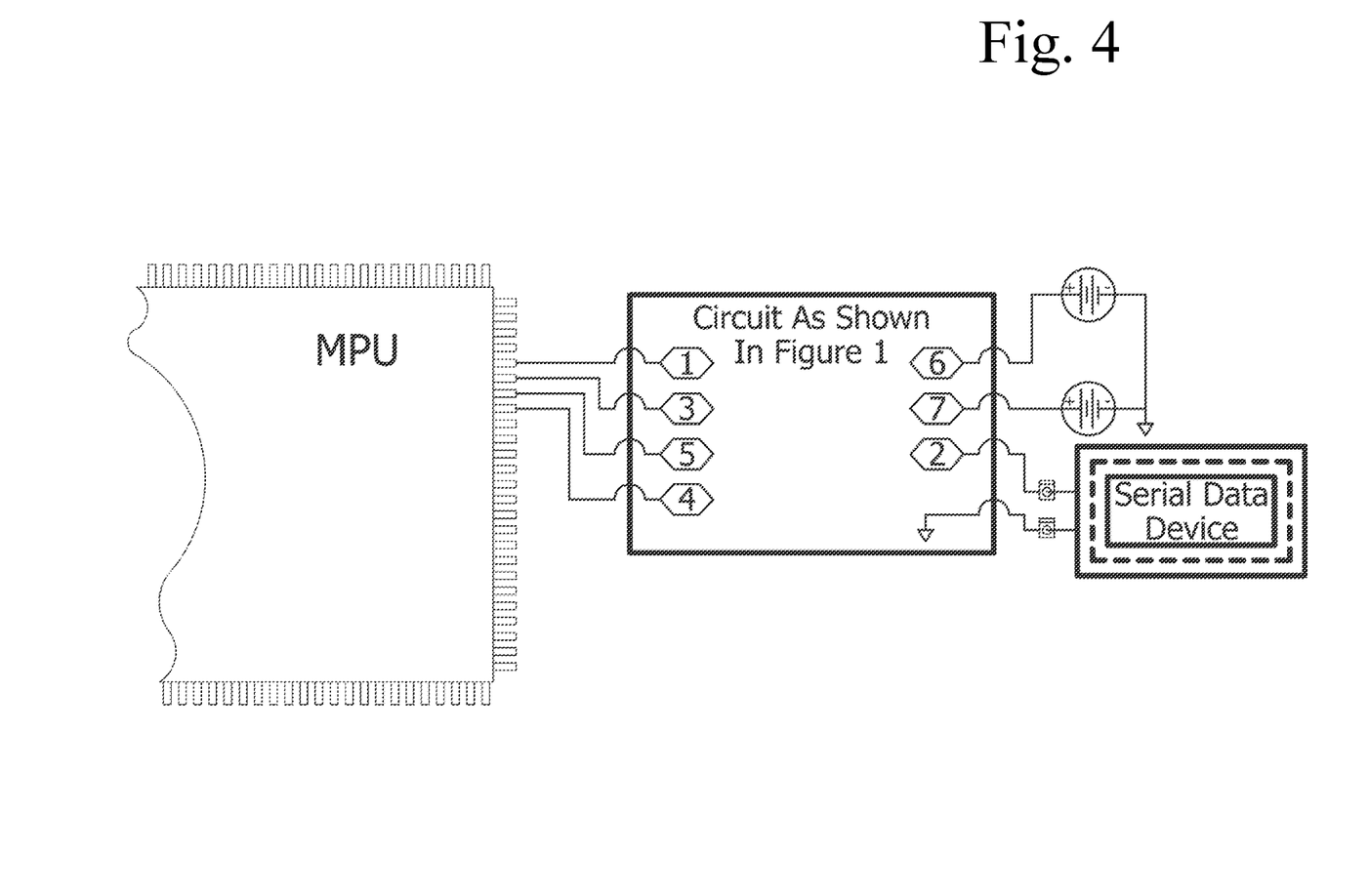
FIG. 4 shows a data transmit mode of the data transmit and receive mode of the multifunction terminal for alarm systems.
Figure 5:
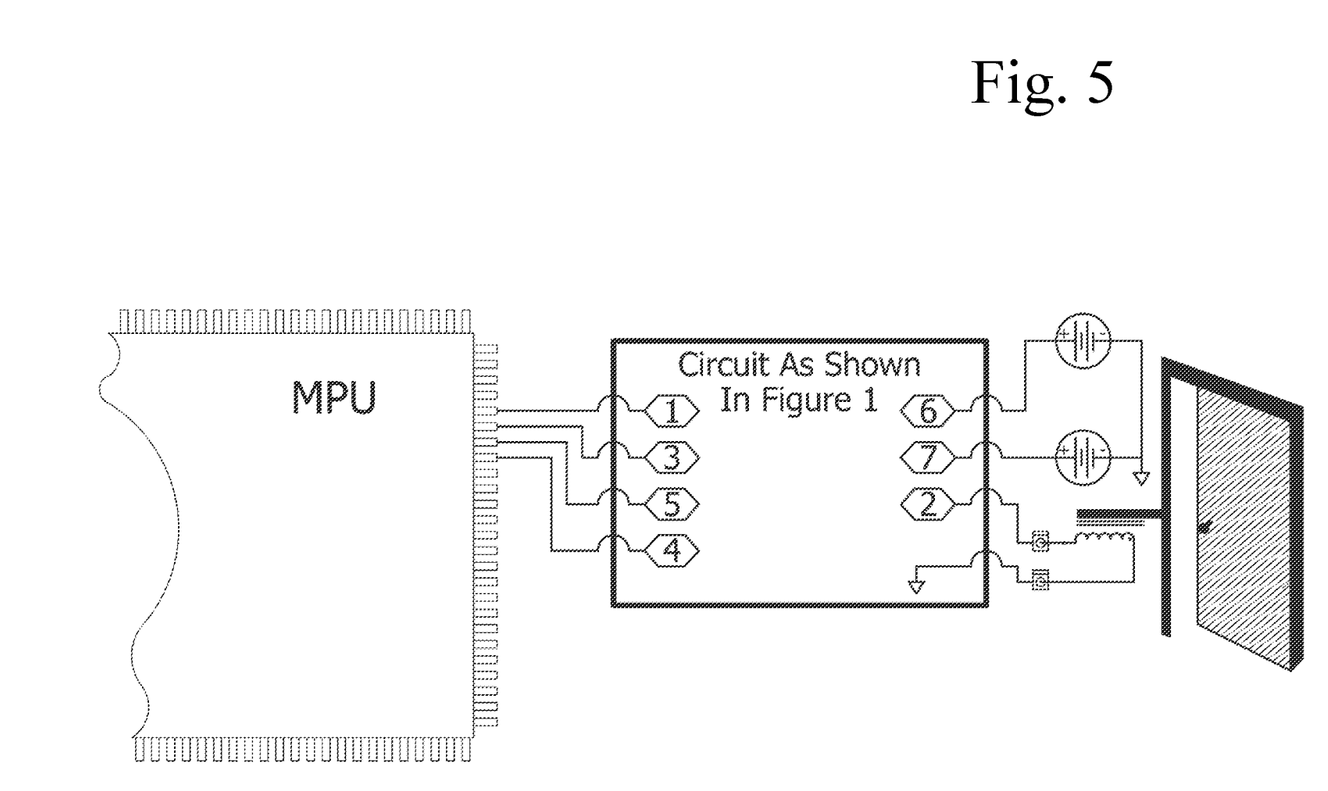
FIG. 5 shows a high current mode sourcing of the multifunction terminal for alarm systems.

As is depicted in FIGS. 3 and 4, in some embodiments, there may be a data transmit and receive mode, which may be serial implementations of a single port. In some embodiments, a data bus design may use a version of I2C where one line is a clock and the other data. Using two of the Multifunction Terminals for Alarm Systems circuit, one circuit (electronically at 'To-Devices') may be attached to the clock on the bus and the second may be attached to the data line.

In some embodiments the Bit attached to the clock input may be configured to generate an interrupt on either the rising or falling edge and at such time, software may read the other MPU-Bit-X value. The word may then be assembled according to word length, checked for parody and/or stop bits. In some embodiments, if a pair of circuits were to be used to transmit data, either circuit may generate the clock pulses and the second circuit may transmit the data bits at the correct moment in time depending on the protocol used. In some embodiments, if the transmission is slow enough, with a syncing train of pulses, a single circuit may be implemented.

Direct Current Mode

Figure 6:
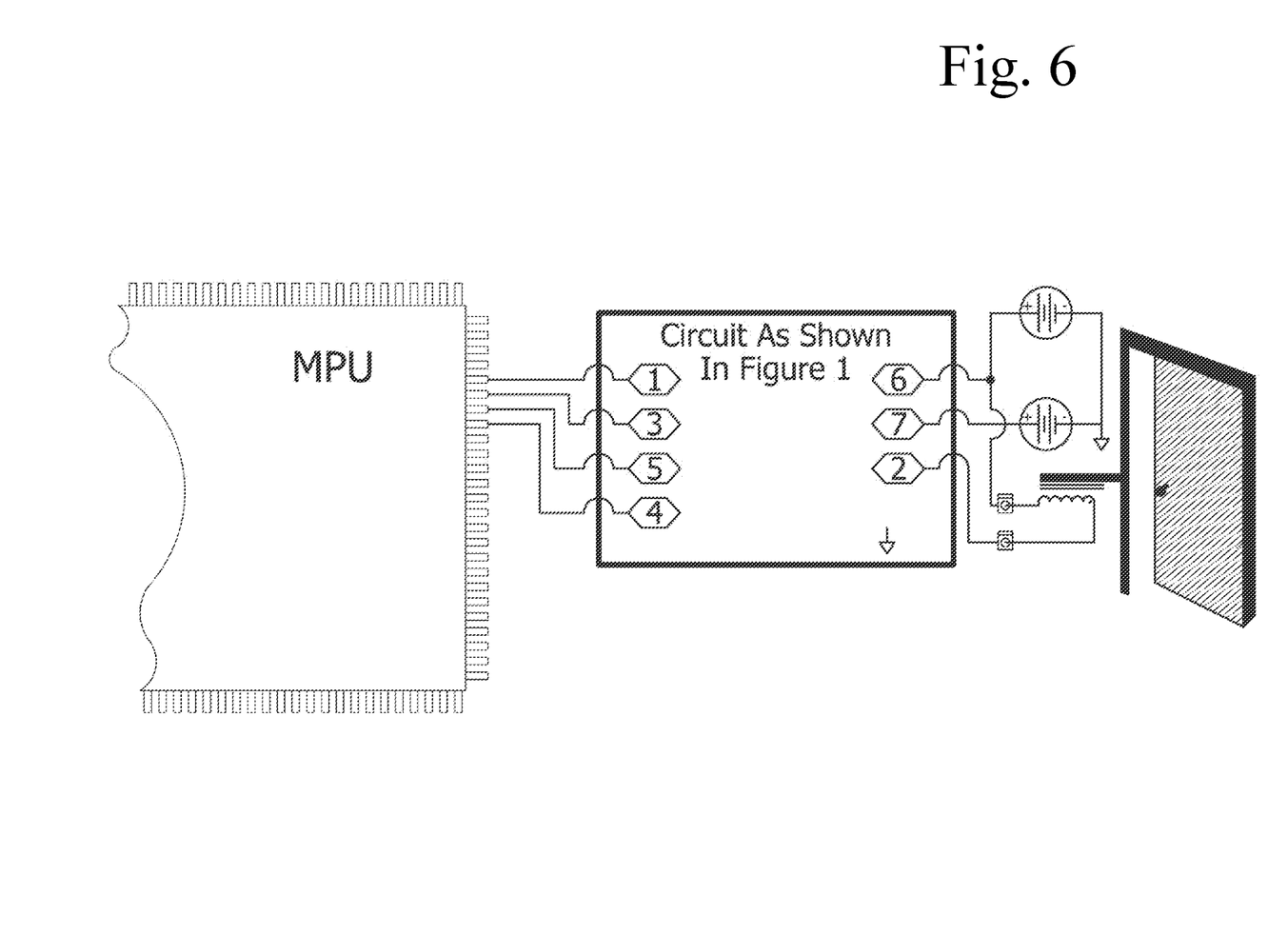
FIG. 6 shows a high current mode sinking of the multifunction terminal for alarm systems.
Figure 7:
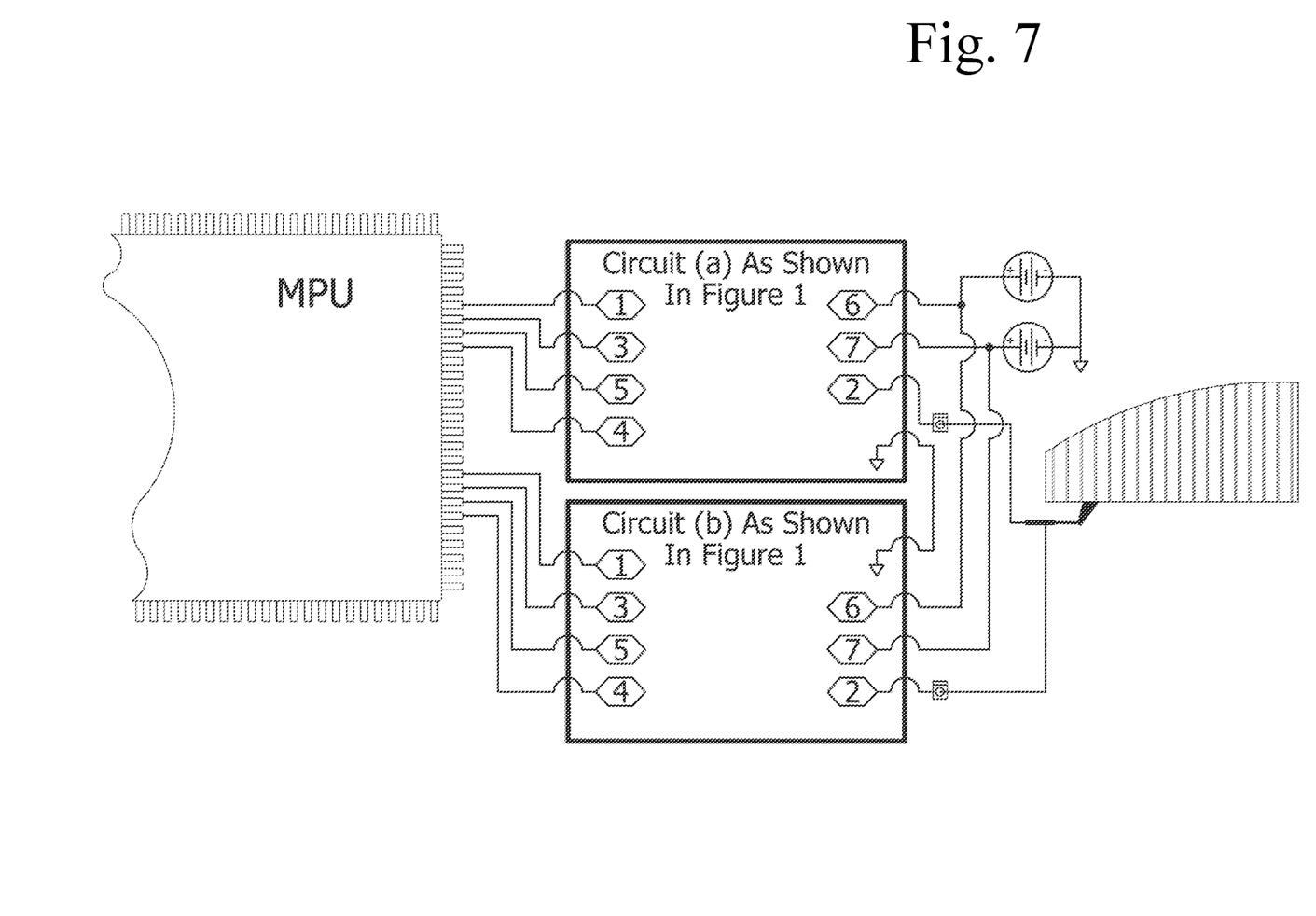
FIG. 7 shows a high current reversing polarity mode of the multifunction terminal for alarm systems.

As is depicted in FIG. 6, in some embodiments of the present invention there may be a direct current mode. In such embodiments, the MPU-Bit-X, with High Current Enable set High, may either Source Voltage/Current at 'To-Devices' or Sink Voltage/Current at 'To-Devices'. This method of using only the MPU-Bit-X to drive devices might have unintended consequences. For instance, driving inductive loads when Voltage and or current is stopped abruptly, there are usually spikes in back EMF forces. In some embodiments the circuit of the present invention may be designed to use the enable to turn on and off the output set by the status of MPU-Bit-X.

In some embodiments, to drive Direct Current Loads, the Pulse Width at High Current Enable may not vary. The pulses may either be a solid '1,' or a percentage of the supply voltage from High Current Voltage supply. In some embodiments, for example, if 12 Volts is required and High Current Supply is 24 Volts, the duty cycle at High Current Enable may be approximately 50%. In such embodiments the MPU 'Bit' may remain 'High' for the duration that the Voltage and Current may be required along with the PWM signal at High Current Enable. In some embodiments, to reverse the Direct Current, a second circuit may be used which may reverse the direction that current is traveling. For illustration purposes, in some embodiments, PWM is shown as a higher Voltage than required and may be present at the High Current/Voltage Source.

In some embodiments, most Electronic Door Strikes a DC coil to 'Open' the latch of a door, which may enable entry, of which may be 24 or 12 Volts DC.

Alternating Current Mode

As is depicted in FIG. 8, in some embodiments of the present invention there may be an alternating current mode. In such embodiments, a method may be used to generate a sine wave with the circuit. The Multifunction Terminals for Alarm Systems circuit with High Current set at a digital '1,' may either Source or Sink a load. In some embodiments, the proper method to drive a high current load may be to set the MPU Bit to a '1,' and PWM the high current enable.

In some embodiments, as is depicted in the example input to generate alternating current sign wave with multifunction terminals for alarm systems of FIG. 8, narrow pulses may be starting and ending with the pulses the widest in the middle of ½ the period driving the load. This may be to generate a sine Wave. This is for illustration purposes only and each engineer must design their pulses to properly drive the circuit in their design.

In some embodiments, a second circuit may be used to drive the current in the opposite direction, hence Alternating Current. Sprinkler Valves are an example of a 24 Volt AC requirement.

In some embodiments, with higher voltages and use of a third circuit, speed control of Reversible AC motors is possible. In some embodiments, AC Motor rotation speed may be directly related to the input frequency.

Interfacing

All the connections may be made to a port on the MPU, electrically, which may be done with solder to a pin. In some embodiments of the present invention, the part of the circuit labeled MPU-Bit-X may be configured to measure Analog Voltages. Analog Enable may connect a port on the MPU that outputs a 1 or a 0, depending on mode of the present invention.

In some embodiments, High Current Enable may be connected a port on the MPU that can be configured to output Pulse Width Modulated outputs which may be a 1 or 0, depending on the mode and Voltage output desired.

In some embodiments, Low Current Enable 7 may be connected to a port on the MPU that may be configured to output Pulse Width Modulated outputs which are a 1 or 0, depending on the mode and Voltage output desired.

In some embodiments, a single source may be used for both the High Current Source and the Low Current Source 7.

Software

The software used in the present invention may depend on what MPU is chosen. The proper Compiler may be required to convert software written in, for example, C, C++, C#, Python, or any other programming language into machine language that a specific MPU may understand. For example, using a modern IDE (Integrated Dynamic Environment), Arduino, some embodiments may utilize a command such as: val=analogRead(analogPin). Such a command may read an input pin from the present invention.

For the software that is used in connection with some embodiments of the present invention there may be many choices. For example, the Arduino IDE High Level code may be much simpler, but a software engineer may not have control over how the software is implemented unless Low Level Commands are used.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention not be limited by this detailed description, but by the claims and the equivalents to the claims appended hereto.

What is claimed is:

1. A multifunction interface circuit configured to interoperate between a processor and at least one device that may be used by an alarm system, the multifunction interface circuit comprising:
    a first port configured to couple to the processor, wherein the first port is a bi-directional port;
    a second port configured to couple to the at least one device; wherein the second port is a bi-directional port;
    a third port configured to couple to the processor;
    a fourth port configured to couple to the processor;
    a fifth port configured to couple to the processor;
    a sixth port configured to couple to a voltage supply or current supply; and
    a seventh port configured to couple to a voltage supply or current supply;
    wherein the first port is configured to output an analog signal to the processor if and when the fourth port is a logical low, the fifth port is a logical low, and an external end of line (EOL) resister is present between 2 and ground;
    wherein the first port is configured to output a digital signal to the processor if and when the fourth port is a logical low, the fifth port is a logical low, and a binary signal provided as input at the second port;
    wherein the first port is configured to receive a data signal from the processor, and the data signal transmitted on the second port; wherein the second port is configured to transmit a logical high if and when the first port is set to a logical high and the fourth port is set to a logical high;
    wherein the second port is configured to transmit a voltage and current at the sixth port if and when the first port is set to a logical high and the fifth port is set to a logical high;
    wherein the second port is configured to transmit a Pulse Width Modulation (PWM) signal if and when the first port is set to a logical high and the fifth port is set to alternate between a logical high and logical low;
    wherein the second port is configured to transmit a sinusoidal current signal if and when the first port is set to a logical high and the fifth port is driven by a PWM signal set to alternate a pulse width between a logical high and logical low;
    wherein the second port is configured to transmit a selectable direct current signal at voltage; Vsel, if and when the sixth port is coupled to a voltage source at voltage, Vmax, the first port is set to a logical high, and the fifth port is set to alternate between a logical high and logical low, wherein the voltage Vsel is a function of the duty cycle of the logical high on the fifth port; and
    wherein the third port is configured to change a resistance between the first port and second port if and when an external end of line (EOL) resistor is connected between the second port and ground.

2. The multifunction interface circuit of claim 1, further comprising a plurality of transistors.

3. The multifunction interface circuit of claim 2, wherein the plurality of transistors comprises a plurality of MOSFET transistors.

4. The multifunction interface circuit of claim 3, wherein the processor is selected from the group consisting of: an x86 based processor, a CISC (complex instruction set computer) processor, and a RISC (reduced instruction set computer) processor.

5. The multifunction interface circuit of claim 3, wherein the at least one alarm system device is selected from the group consisting of: an alarm, a lock, a door lock solenoid, an electronic keypad, a frequency-operated button, an electronic key, a card reader, a sensor, an end-of-line sensor configured to determine whether a door or window is open or closed, a speaker, a motor controlling the position of a door or gate, a valve operated by an alternating current, and a sprinkler valve.

6. The multifunction interface circuit of claim 1, wherein a single printed circuit board comprises the multifunction interface circuit.

7. A multifunction interface circuit configured to interoperate between a processor and at least one device that may be used by an alarm system, the multifunction interface circuit comprising:
 a first port configured to couple to the processor, wherein the first port is a bi-directional port;
 a second port configured to couple to the at least one device; wherein the second port is a bi-directional port;
 a third port configured to couple to the processor;
 a fourth port configured to couple to the processor;
 a fifth port configured to couple to the processor;
 a sixth port configured to couple to a voltage supply or current supply; and
 a seventh port configured to connect to a voltage supply or current supply;
 a first circuit means configured to output an analog signal from the first port to the processor if and when an external EOL resistor is connected between second port and ground;
 a second circuit means configured to output a digital signal from the first port to the processor if and when a voltage from a device is present on the second port;
 a third circuit means configured to receive a data signal from the processor on the first port, and to transmit the data signal on the second port; wherein the second port is configured to transmit a logical high if and when the first port is set to a logical high and the fourth port is set to a logical high;
 a fourth circuit means configured to transmit a voltage and current at the sixth port if and when the first port is set, to a logical high and the fifth port is set, to a logical high;
 a fifth circuit means configured to output a Pulse Width Modulation (PWM) signal at the second port if and when the first port is set to a logical high and the fifth port is set to alternate between a logical high and logical low;
 a sixth circuit means configured to output a sinusoidal current signal at the second port if and when the first port is set to a logical high and the fifth port is driven by a PWM signal set to alternate a pulse width between a logical high and logical low,
 a seventh circuit means configured to output a selectable direct current signal at voltage Vsel from the second port if and when the sixth port is coupled to a voltage source at voltage Vmax, the first port is set to a logical high, and the fifth port is set to alternate between a logical high and logical low, wherein the voltage Vsel is a function of the duty cycle of the logical high on the fifth port;
 an eighth circuit means configured to change a resistance between the first port and second port if and when second port is configured with an end of line (EOL) resistor connected between the second port and ground;
 a ninth circuit means configured to alter a voltage provided as output on the first port if and when the third port receives a logical low from the processor; and
 a tenth circuit means configured to alter a voltage provided as output on the first port if and when the third port receives a logical high from the processor.

8. The multifunction interface circuit of claim 7, wherein the first circuit means, second circuit means, third circuit means, fourth circuit means, fifth circuit means, sixth circuit means, and seventh circuit means each comprise at least one transistor.

9. The multifunction interface circuit of claim 8, wherein the first circuit means, second circuit means, third circuit means, fourth circuit means, fifth circuit means, sixth circuit means, and seventh circuit means each comprise at least one MOSFET transistor.

10. The multifunction interface circuit of claim 9, wherein the at least one alarm system device is selected from the group consisting of: an alarm, a lock, a door lock solenoid, an electronic keypad, a frequency-operated button, an electronic key, a card reader, a sensor, an end-of-line sensor configured to determine whether a door or window is open or closed, a speaker, a motor controlling the position of a door or gate, a valve, and a sprinkler valve.

11. The multifunction interface circuit of claim 7, wherein a single printed circuit board comprises the multifunction interface circuit.

12. The multifunction interface circuit of claim 1, wherein the third port is configured to alter a voltage provided as output on the first port if and when the third port receives a logical low from the processor; wherein the third port is configured to alter a voltage provided as output on the first port if and when the third port receives a logical high from the processor; and wherein the third port is configured to output a voltage to the processor if and when an external EOL resistor is connected between the second port and ground.

* * * * *